US012381188B2

(12) United States Patent
Um et al.

(10) Patent No.: US 12,381,188 B2
(45) Date of Patent: Aug. 5, 2025

(54) DISPLAY DEVICE USING SEMICONDUCTOR LIGHT EMITTING DIODE AND METHOD FOR MANUFACTURING THE SAME

(71) Applicants: LG ELECTRONICS INC., Seoul (KR); UNIVERSITY-INDUSTRY COOPERATION GROUP OF KYUNG HEE UNIVERSITY, Yongin-si (KR)

(72) Inventors: Jaegwang Um, Seoul (KR); Sunghwan Kim, Seoul (KR); Jin Jang, Seoul (KR)

(73) Assignees: LG ELECTRONICS INC., Seoul (KR); UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 880 days.

(21) Appl. No.: 17/268,325

(22) PCT Filed: Aug. 12, 2019

(86) PCT No.: PCT/KR2019/010189
§ 371 (c)(1),
(2) Date: Feb. 12, 2021

(87) PCT Pub. No.: WO2020/036385
PCT Pub. Date: Feb. 20, 2020

(65) Prior Publication Data
US 2021/0167177 A1 Jun. 3, 2021

(30) Foreign Application Priority Data
Aug. 14, 2018 (KR) .................. 10-2018-0095099

(51) Int. Cl.
*H01L 25/075* (2006.01)
*H01L 25/16* (2023.01)
(Continued)

(52) U.S. Cl.
CPC ........ *H01L 25/0753* (2013.01); *H01L 25/167* (2013.01); *H10D 30/031* (2025.01);
(Continued)

(58) Field of Classification Search
CPC ............... H01L 25/167; H01L 25/0753; H01L 29/41733
See application file for complete search history.

(56) References Cited

U.S. PATENT DOCUMENTS 5,414,283 A * 5/1995 den Boer .............. G02F 1/1368
257/E27.111
5,847,413 A * 12/1998 Yamazaki ............ G09G 3/3688
257/E21.162
(Continued)

FOREIGN PATENT DOCUMENTS

CN 104617154 A * 5/2015
JP 2006-352087 A 12/2006

OTHER PUBLICATIONS

CN104617154 machine translation (Year: 2024).*

*Primary Examiner* — Vincent Wall
(74) *Attorney, Agent, or Firm* — Birch, Stewart, Kolasch & Birch, LLP

(57) ABSTRACT

Discussed is a display device including a substrate, a thin film transistor formed on the substrate, the thin film transistor including a source electrode, a drain electrode, and a gate electrode, and a plurality of semiconductor light emitting devices emitting light so as to each form individual pixels and each having a p-type electrode and an n-type electrode, wherein at least one of the plurality of of the
(Continued)

semiconductor light emitting devices is disposed so that one of the p-type electrode and the n-type electrode overlaps the source electrode of the thin film transistor.

19 Claims, 11 Drawing Sheets

(51) Int. Cl.
  *H10D 30/01* (2025.01)
  *H10D 30/67* (2025.01)
  *H10D 64/23* (2025.01)
  *H10D 86/40* (2025.01)
  *H10D 86/60* (2025.01)
  *H10K 59/12* (2023.01)
(52) U.S. Cl.
  CPC ..... *H10D 30/6729* (2025.01); *H10D 30/6755* (2025.01); *H10D 64/258* (2025.01); *H10D 86/411* (2025.01); *H10D 86/60* (2025.01); *H10K 59/12* (2023.02)

(56) References Cited

U.S. PATENT DOCUMENTS

| | | | |
|---|---|---|---|
| 10,008,610 B2 * | 6/2018 | Park | H01L 29/7869 |
| 10,658,392 B1 * | 5/2020 | Chen | H01L 27/1222 |
| 10,971,525 B1 * | 4/2021 | Zhou | H01L 29/78642 |
| 10,985,187 B1 * | 4/2021 | Nan | H01L 29/78696 |
| 2005/0199959 A1 * | 9/2005 | Chiang | H01L 29/7869 |
| | | | 257/368 |
| 2014/0134795 A1 * | 5/2014 | Mochizuki | H01L 27/14659 |
| | | | 438/104 |
| 2016/0365404 A1 | 12/2016 | Seol et al. | |
| 2017/0062514 A1 * | 3/2017 | Park | H01L 29/7869 |
| 2017/0301724 A1 | 10/2017 | Lee | |
| 2017/0345801 A1 | 11/2017 | Lin et al. | |
| 2018/0040774 A1 * | 2/2018 | Lee | H01L 33/62 |
| 2021/0167177 A1 * | 6/2021 | Um | H01L 27/1218 |

* cited by examiner

[Fig. 1]
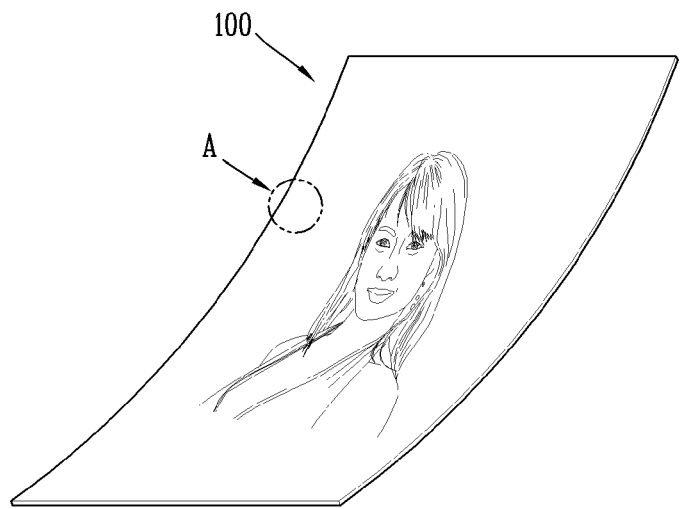
[Fig. 2]
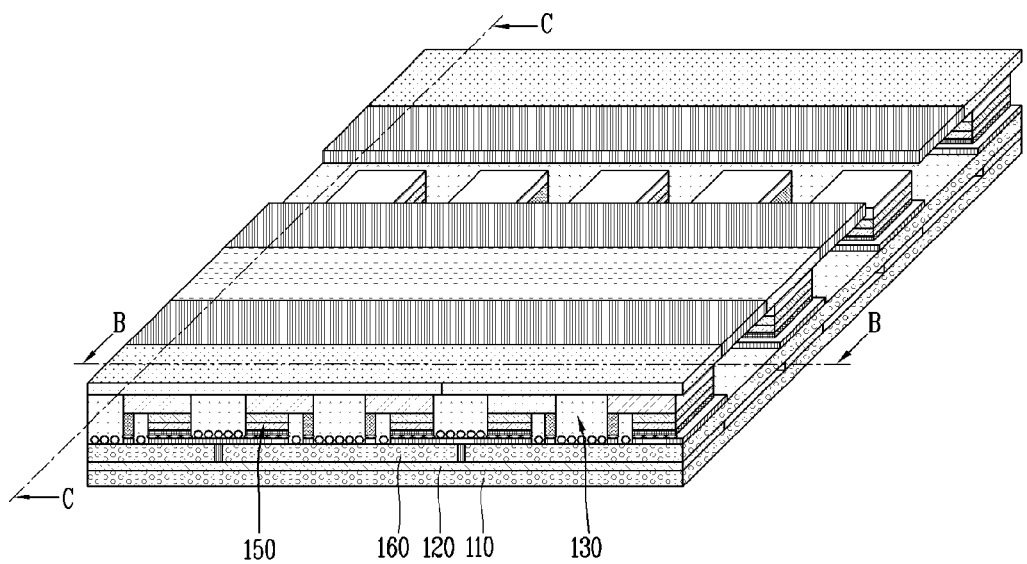

[Fig. 5a]
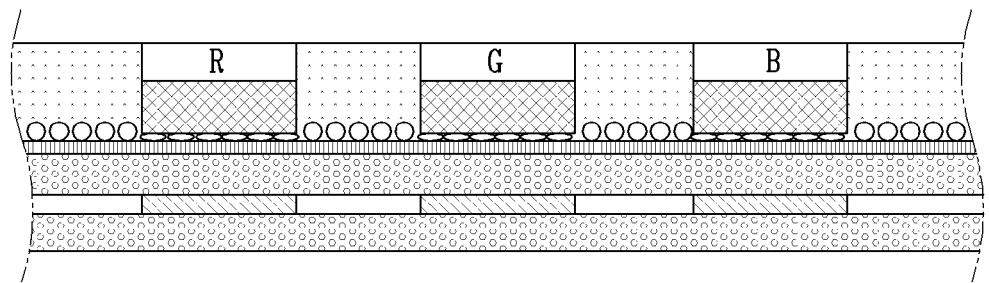
[Fig. 5b]
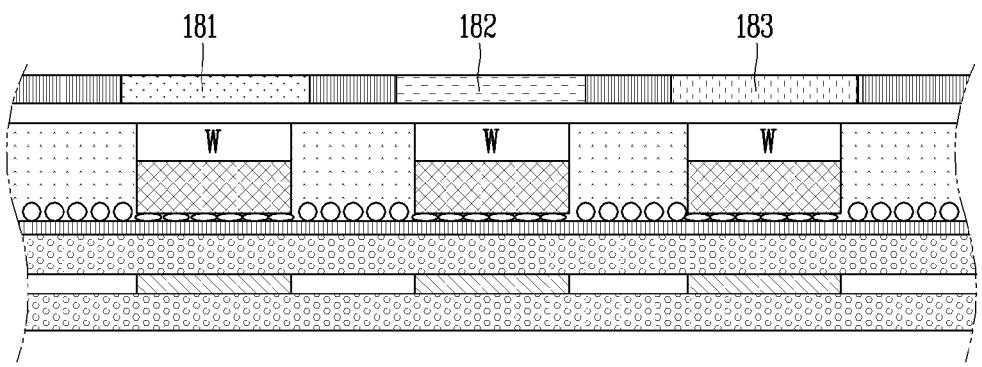
[Fig. 5c]
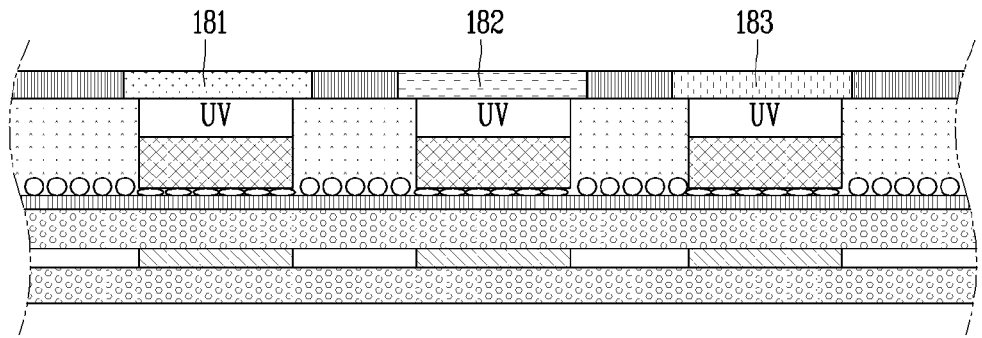

[Fig. 6]
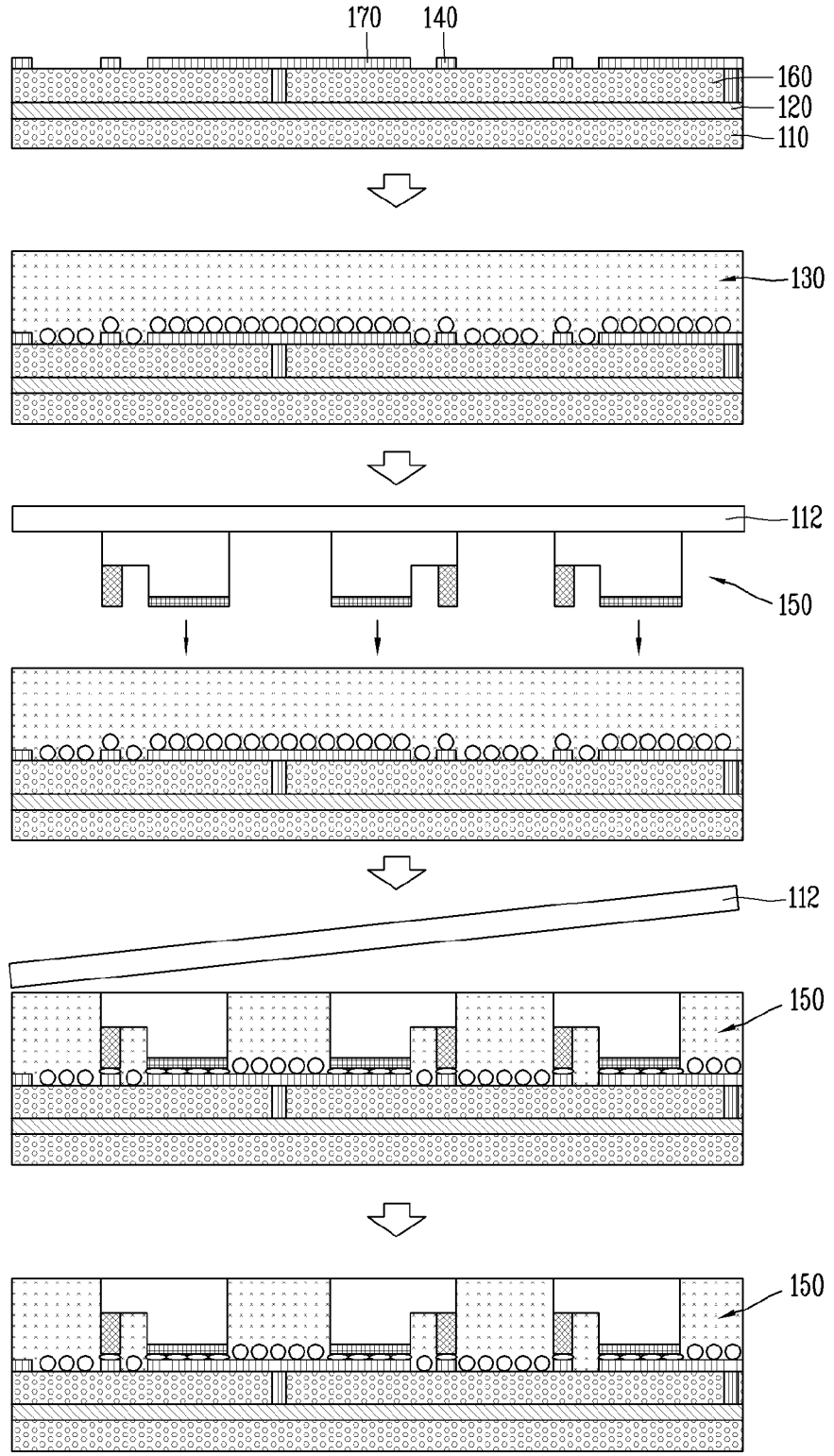

[Fig. 7]
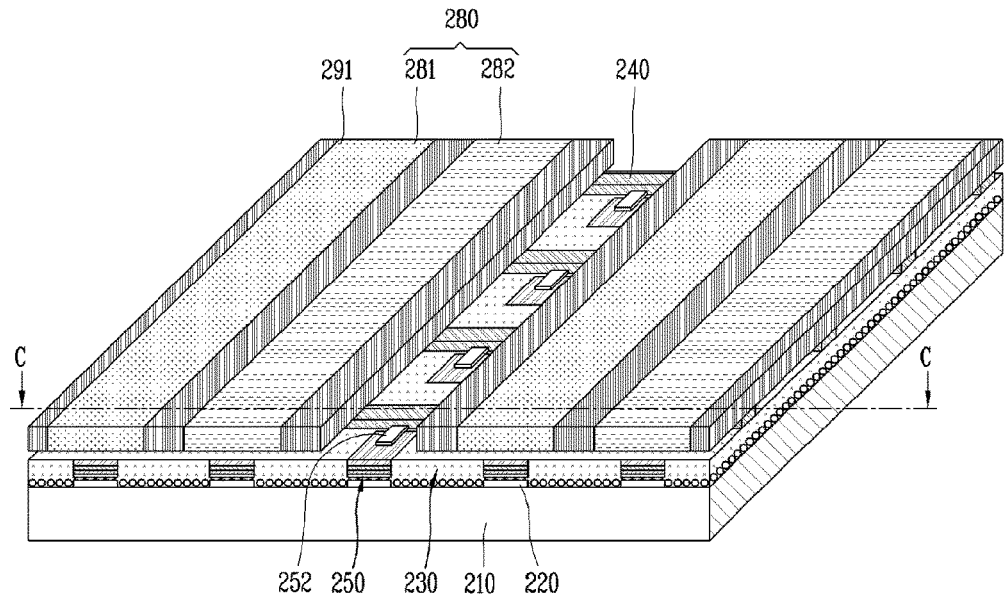
[Fig. 8]
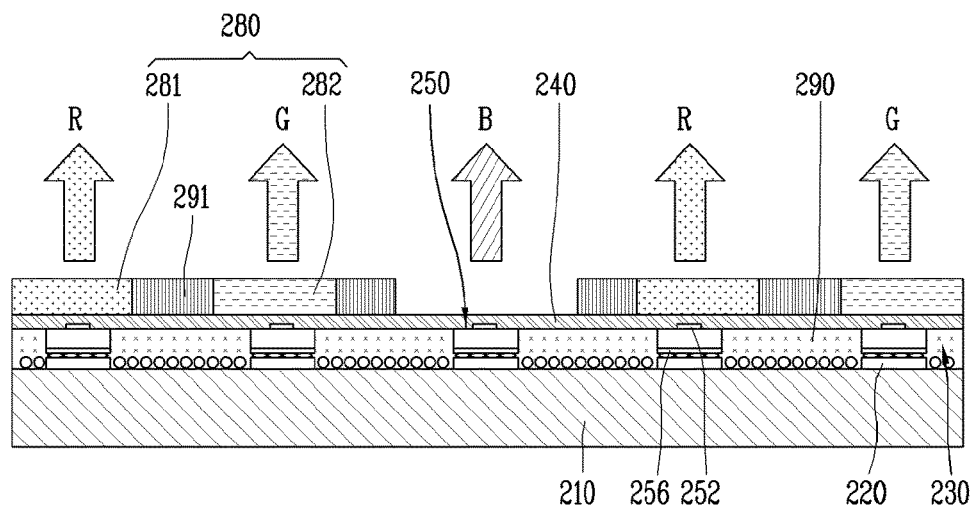
[Fig. 9]
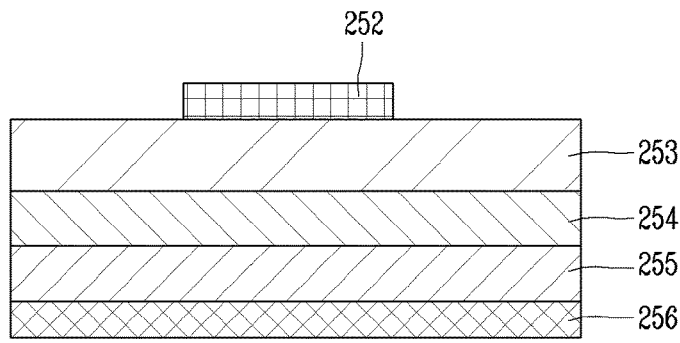

[Fig. 13]
(a)
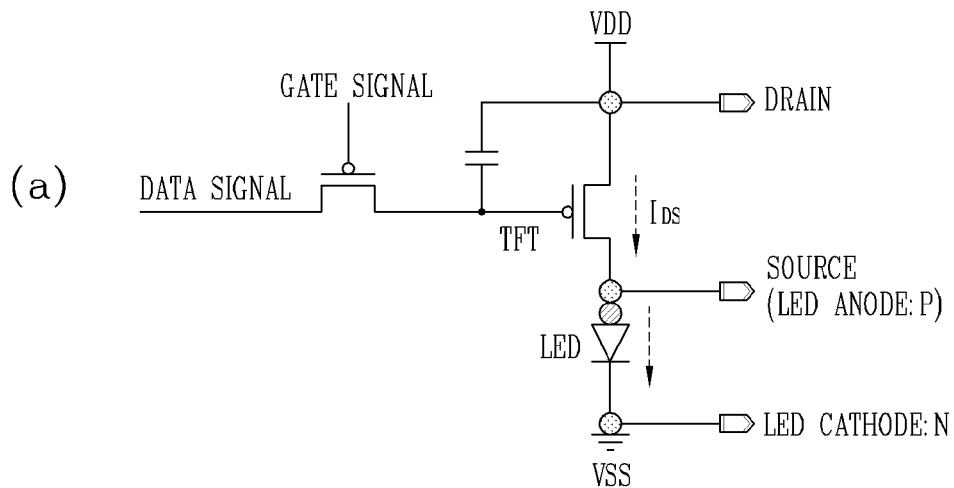
(b)
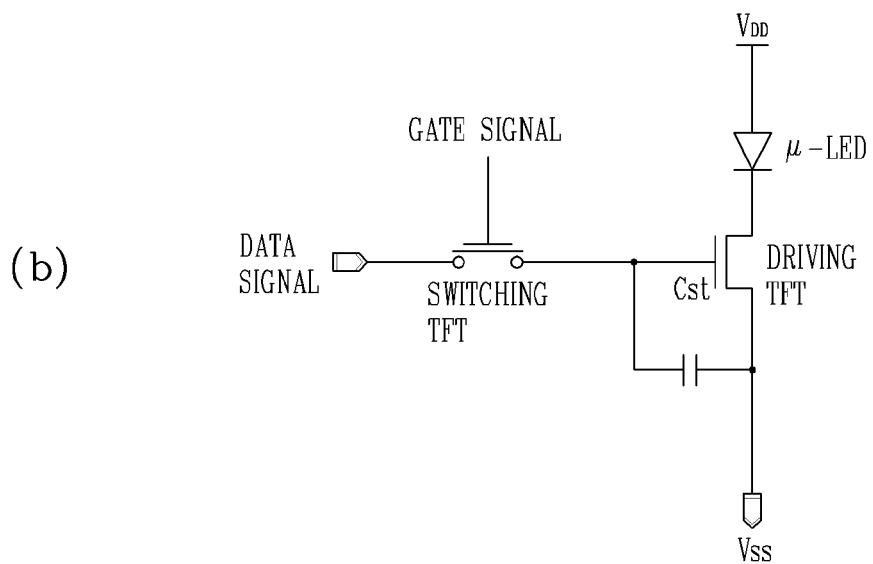

[Fig. 16]
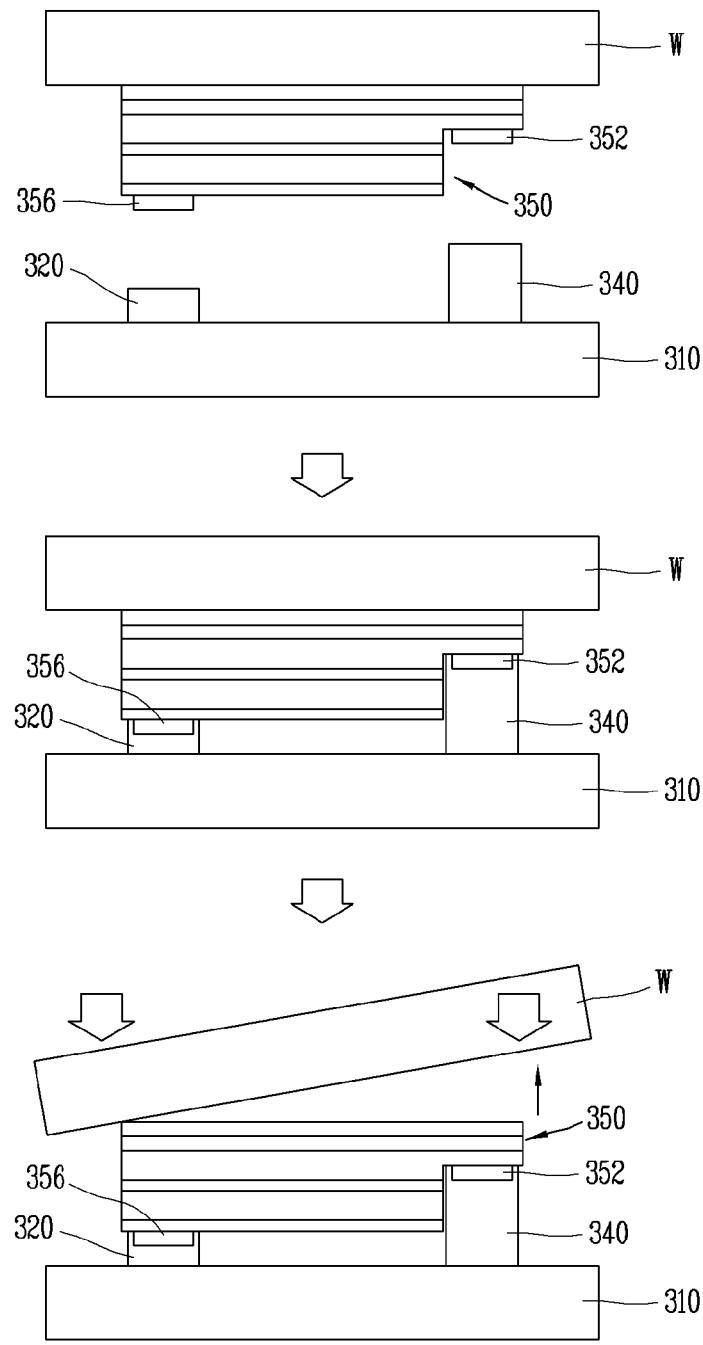

DISPLAY DEVICE USING SEMICONDUCTOR LIGHT EMITTING DIODE AND METHOD FOR MANUFACTURING THE SAME

CROSS REFERENCE TO RELATED APPLICATIONS

This application is the National Stage filing under 35 U.S.C. 371 of International Application No. PCT/KR2019/010189, filed on Aug. 12, 2019, which claims the benefit of earlier filing date and right of priority to Korean Application No. 10-2018-0095099, filed on Aug. 14, 2018, the entire contents of all these applications are hereby expressly incorporated by reference into the present application.

TECHNICAL FIELD

The present invention relates to a display device, and more particularly, to a flexible display device using a semiconductor light emitting diode, and a method for manufacturing the same.

BACKGROUND ART

In recent years, display devices having excellent characteristics such as a thin shape, flexibility, and the like, are being developed in a field of a display technology. On the contrary, currently commercialized main displays are represented by liquid crystal displays (LCDs) and active matrix organic light emitting diodes (AMOLEDs).

However, there exist problems such as not-so-fast response time and difficult implementation of flexibility in case of LCDs, and there exist drawbacks such as short life span, not-so-good yield and low flexibility in case of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

In the related art active matrix display device is provided with a thin film transistor and a luminescent body within a pixel, and regions thereof are not separated. In the case of an organic light emitting device, since an organic luminescent material causes a great deviation with respect to characteristics and yield depending on a surface condition of a deposition surface, it is important to secure a space for only the organic light emitting device. In the case of a micro LED, a bonding process for N-pad and P-pad is included. Since physical pressure and temperature generated during the bonding process apply direct stress to a semiconductor, it is necessary to distinguish a bonding region.

In order to minimize a size of a thin film transistor for a space division within a limited pixel size, there is a disadvantage in that a process using expensive equipment such as E-beam is required instead of a widely known photolithography process. In the case of a TFT manufactured through a general photolithography process, a channel length can be made as short as ~2 μm but it seriously affects a TFT threshold voltage due to a short channel effect. To utilize this, the threshold voltage should be compensated for by using a greater number of transistors.

DISCLOSURE OF INVENTION

Technical Problem

An aspect of the present invention is to provide a structure in which a thin film transistor and a semiconductor light emitting diode are efficiently arranged within a limited pixel.

Solution to Problem

To achieve the aspect and other advantages of the present invention, there is provided a display device, including a substrate, a thin film transistor disposed on the substrate, and having a source electrode, a drain electrode, and a gate electrode, and a plurality of semiconductor light emitting devices emitting light so as to form individual pixels and each having a p-type electrode and an n-type electrode, wherein each of the semiconductor light emitting devices is disposed such that one of the p-type electrode and the n-type electrode overlaps the source electrode of the thin film transistor.

In one embodiment, the thin film transistor may include a gate electrode disposed on the substrate, a source electrode located on the gate electrode, and a drain electrode having an annular shape or a shape in which a part of the annular shape is removed, and surrounding the source electrode.

In one embodiment, the thin film transistor may further include a passivation layer disposed on the source and drain electrodes, and a connection electrode penetrating through the passivation layer to electrically connect the source electrode to one of the p-type electrode and the n-type electrode.

In one embodiment, the one of the p-type electrode and the n-type electrode, the source electrode, and the connection electrode may overlap one another.

In one embodiment, the thin film transistor may further include a gate insulating film located between the gate electrode and the source and drain electrodes, and a semiconductor layer located between the gate insulating layer and the source and drain electrodes.

In one embodiment, the semiconductor layer may be made of at least one of indium (In), gallium (Ga), zinc (Zn), tin (Sn), and aluminum (Al).

In one embodiment, the source electrode may overlap the p-type electrode.

In one embodiment, the thin film transistor may further include an etch stopper located between the semiconductor layer and the source and drain electrodes.

In one embodiment, the etch stopper may have an annular shape, and the semiconductor layer may have a circular shape.

In one embodiment, the gate electrode may have a circular shape.

Advantageous Effects of Invention

The present invention also provides a method for manufacturing a display device including a thin film transistor and a plurality of semiconductor light emitting devices. Specifically, the present invention provides a method for manufacturing a display device, including forming a thin film transistor on a substrate, the thin film transistor including a source electrode, a drain electrode and a gate electrode, forming a connection electrode overlapping the source electrode, forming a wiring electrode on the substrate, and transferring a plurality of semiconductor light emitting devices, each having a p-type electrode and an n-type electrode, on the substrate having the thin film transistor formed thereon, wherein each of the plurality of semiconductor light emitting devices is transferred such that one of the p-type electrode and the n-type electrode overlaps the source electrode and the connection electrode.

BRIEF DESCRIPTION OF DRAWINGS

FIG. 1 is a conceptual view illustrating one embodiment of a display device using a semiconductor light emitting diode according to the present invention.

FIG. 2 is a partially enlarged view of part A of FIG. 1, and FIGS. 3A and 3B are sectional views taken along the lines B-B and C-C of FIG. 2.

FIGS. 5A to 5C are conceptual views illustrating various forms of realizing a color in relation to a flip chip type semiconductor light emitting device.

FIG. 6 is a sectional view illustrating a method of manufacturing a display device using a semiconductor light emitting diode according to the present invention.

FIG. 7 is a perspective view illustrating another embodiment of a display device using a semiconductor light emitting diode according to the present invention.

FIG. 8 is a sectional view taken along the line D-D of FIG. 7.

FIG. 9 is a conceptual view illustrating a vertical type semiconductor light emitting device of FIG. 8.

FIG. 13 is a circuit view of a display device according to the present invention.

FIGS. 15 and 16 are conceptual views illustrating a method of manufacturing a display device according to the present invention.

MODE FOR THE INVENTION

Figure 3A:
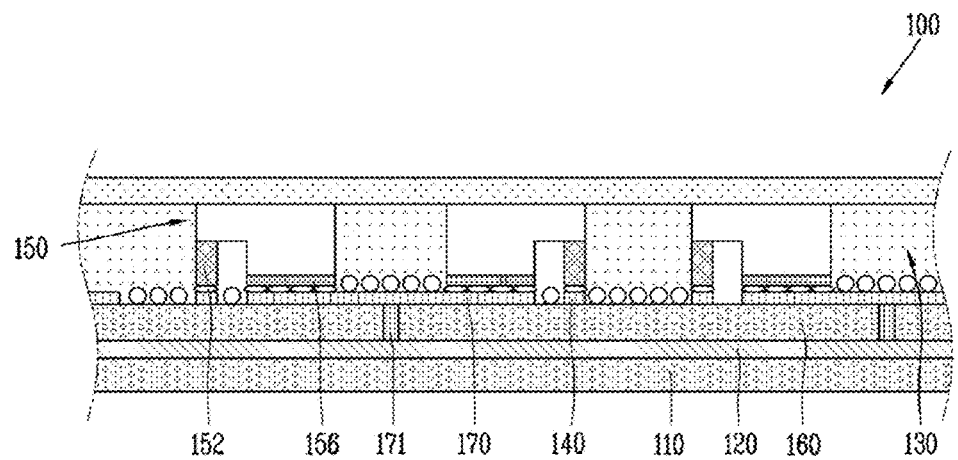

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present invention is not limited by the accompanying drawings.

It will be understood that when an element such as a layer, area or substrate is referred to as being "on" another element, it can be directly on the element, or one or more intervening elements may also be present.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it will be readily apparent to those skilled in the art that the configuration according to the embodiments described herein may also be applied to a new product type that will be developed later if the device is a device capable of emitting light.

FIG. 1 is a conceptual view illustrating one embodiment of a display device using a semiconductor light emitting diode according to the present invention.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second state may be visual information output on a curved surface. Such visual information is realized by independently controlling an emission of unit pixels (sub-pixels) arranged in a matrix form. The unit pixel denotes an elementary unit for representing one color.

The sub-pixel of the flexible display may be implemented by a semiconductor light emitting device. The present invention exemplarily illustrates a light emitting diode (LED) as a type of semiconductor light emitting device for converting current into light. The light emitting diode may be formed with a small size to perform the role of a sub-pixel even in the second configuration through this.

Hereinafter, a flexible display implemented using the light emitting diode will be described in more detail with reference to the accompanying drawings.

Figure 3B:
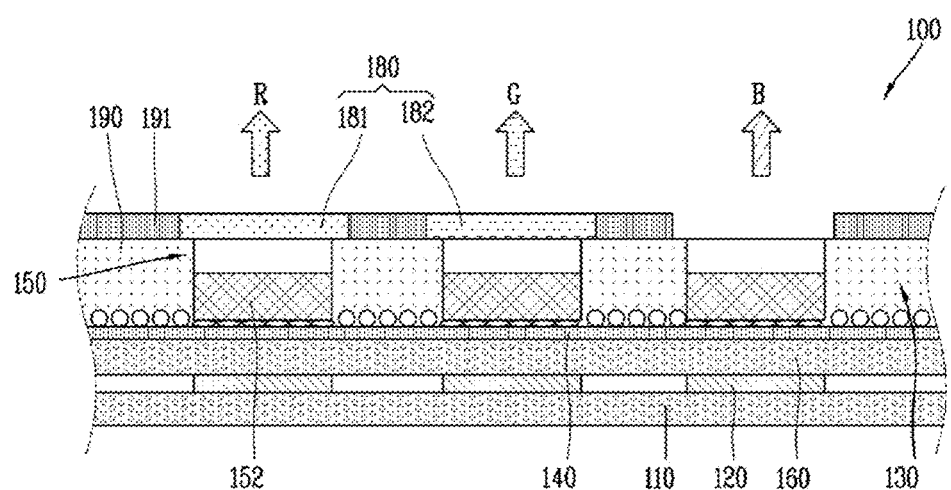
Figure 4:
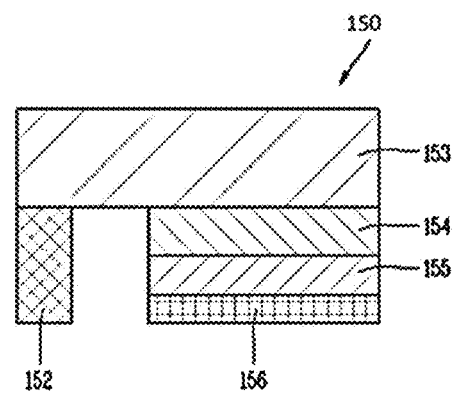
FIG. 4 is a conceptual view illustrating a flip chip type semiconductor light emitting device of FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

Referring to FIGS. 2, 3A and 3B, there is illustrated a display device 100 using a passive matrix (PM) type semiconductor light emitting device as a display device 100 using a semiconductor light emitting device. However, an example described below may also be applicable to an active matrix (AM) type semiconductor light emitting device.

The display device 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display device. The substrate 110 may alternatively be made of any material with insulating property and flexibility, for example, polyethylene naphthalate (PEN), polyethylene terephthalate (PET), and the like. Furthermore, the substrate 110 may be either one of transparent and non-transparent materials.

The substrate 110 may be a wiring substrate provided with the first electrode 120, and thus the first electrode 120 may be placed on the substrate 110.

As illustrated, an insulating layer 160 may be disposed on the substrate 110 on which the first electrode 120 is located, and an auxiliary electrode 170 may be disposed on the insulating layer 160. In this case, a configuration in which the insulating layer 160 is deposited on the substrate 110 may be a single wiring substrate. More specifically, the insulating layer 160 may be formed of a flexible insulating material, such as polyimide (PI), PET, or PEN, and may be formed integrally with the substrate 110 to form a single substrate.

The auxiliary electrode 170 is an electrode that electrically connects the first electrode 120 and the semiconductor light emitting device 150, and is disposed on the insulating layer 160 to correspond to a position of the first electrode 120. For example, the auxiliary electrode 170 may have a dot-like shape and may be electrically connected to the first electrode 120 by an electrode hole 171 formed through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, a layer performing a specific function may be disposed between the insulating layer 160 and the conductive adhesive layer 130, or the conductive adhesive layer 130 may also be disposed on the substrate 110 without the insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film in which an anisotropic conductive medium is mixed with an insulating base member. When heat and pressure are applied, only a specific portion has conductivity by the anisotropic conductive medium. Hereinafter, description will be given of an example that heat and pressure are applied to the anisotropic conductive film, but other methods may alternatively be used to allow the anisotropic conductive film to partially have conductivity. Examples of this method may be a method of applying one of the heat and the pressure, a UV curing method, and the like.

In addition, the anisotropic conductive medium may be, for example, a conductive ball or a conductive particle. According to this embodiment, the anisotropic conductive film is a film in which conductive balls are mixed with an insulating base member. When heat and pressure are applied, only specific portion of the anisotropic conductive film obtains conductivity by the conductive balls. The anisotropic conductive film may be a state of containing a plurality of particles each of which a core of a conductive material is coated with an insulating film made of a polymer material. In this case, the insulating film of a portion to which heat and pressure have been applied is broken and thus obtains the conductivity by the core. At this time, the shape of the core may be deformed to form a layer brought into contact with each other in a thickness direction of the film. As a more specific example, heat and pressure are applied to the entire anisotropic conductive film, and an electric connection in the Z-axis direction is partially formed by a height difference of an object adhered by the anisotropic conductive film.

As another example, the anisotropic conductive film may be a state of containing a plurality of particles each of which the insulating core is coated with the conductive material. In this case, the conductive material in the portion, to which the heat and pressure have been applied, is deformed (stuck, pressed) and thus the portion has the conductivity in the thickness direction of the film. As another example, the conductive material may penetrate through the insulating base member in the Z-axial direction such that the film has the conductivity in its thickness direction. In this case, the conductive material may have a sharp end portion.

The anisotropic conductive film may be a fixed array anisotropic conductive film (ACF) in which conductive balls are inserted into one surface of the insulating base member. More specifically, the insulating base member is formed of a material having adhesiveness, and the conductive balls are concentrated on a bottom portion of the insulating base member. When heat and pressure are applied to the base member, the base member is deformed together with the conductive balls so as to obtain conductivity in a perpendicular direction.

However, the present invention is not limited thereto. The anisotropic conductive film may alternatively be formed by randomly inserting conductive balls into the insulating base member, or may be configured in a form of double-ACF in which a plurality of layers are provided and the conductive balls are disposed in one of the layers.

The anisotropic conductive paste is a combination of a paste and conductive balls, namely, may be a paste in which conductive balls are mixed with a base material having insulating property and adhesiveness. In addition, the solution containing conductive particles may be a solution in which conductive particles or nano particles are contained.

Referring again to the drawing, the second electrode 140 is located at the insulating layer 160 with being spaced apart from the auxiliary electrode 170. In other words, the conductive adhesive layer 130 is disposed on the insulating layer 160 where the auxiliary electrode 170 and second electrode 140 are located.

When the conductive adhesive layer 130 is formed in a state that the auxiliary electrode 170 and second electrode 140 are located on the insulating layer 160 and then the semiconductor light emitting device 150 is connected thereto in a flip chip form with the application of heat and pressure, the semiconductor light emitting device 150 is electrically connected to the first electrode 120 and second electrode 140.

Referring to FIG. 4, the semiconductor light emitting device may be a flip chip type light emitting device.

For example, the semiconductor light emitting device includes a p-type electrode 156, a p-type semiconductor layer 155 on which the p-type electrode 156 is formed, an active layer 154 disposed on the p-type semiconductor layer 155, an n-type electrode 153 disposed on the active layer 154, and an n-type electrode 152 disposed on the n-type semiconductor layer 153 with being spaced apart from the p-type electrode 156 in a horizontal direction. In this case, the p-type electrode 156 may be electrically connected to the auxiliary electrode 170 and the conductive adhesive layer 130, and the n-type electrode 152 may be electrically connected to the second electrode 140.

Referring back to FIGS. 2 and 3, the auxiliary electrode 170 may be formed long in one direction, and one auxiliary electrode may be electrically connected to the plurality of semiconductor light emitting devices 150. For example, the p-type electrodes of the left and right semiconductor light emitting devices based on the auxiliary electrode may be electrically connected to one auxiliary electrode.

More specifically, the semiconductor light emitting device 150 is press-fitted into the conductive adhesive layer 130 by heat and pressure. Accordingly, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no press-fitting of the semiconductor light emitting device. As described above, the conductive adhesive layer 130 allow the mutual connection as well as an electrical connection between the semiconductor light emitting device 150 and the auxiliary electrode 170 and between the semiconductor light emitting device 150 and the second electrode 140.

In addition, the plurality of semiconductor light emitting devices 150 constitute a light emitting device array, and a phosphor layer 180 is formed on the light emitting device array.

The light emitting device array may include a plurality of semiconductor light emitting devices having different brightness values. Each of the semiconductor light emitting devices 150 constitutes a unit pixel and is electrically connected to the first electrode 120. For example, the first electrode 120 may be in plurality. The semiconductor light emitting devices, for example, may be arranged in several rows, and the semiconductor light emitting devices in each row may be electrically connected to one of the plurality of first electrodes.

In addition, since the semiconductor light emitting devices are connected in a form of a flip chip, the semiconductor light emitting devices grown on a transparent dielectric substrate can be used. The semiconductor light emitting devices may be, for example, nitride semiconductor light emitting devices. Since the semiconductor light emitting device 150 has excellent brightness, it can constitute an individual unit pixel even though it has a small size.

According to the drawing, a partition wall 190 may be formed between the semiconductor light emitting devices 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics and simultaneously increase contrast even without an additional black insulator.

As another example, a reflective partition wall may be separately provided as the partition wall 190. In this case, the partition wall 190 may include a black or white insulator according to the purpose of the display device. Reflectivity can be enhanced when the partition wall of the white insulator is used, and reflective characteristics can be obtained and simultaneously contrast can increase when the partition wall of the black insulator is used.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into a color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present invention may not be necessarily limited to this, and the semiconductor light emitting device 150 may be combined with a quantum dot (QD) instead of the phosphor to implement such as red (R), green (G) and blue (B) sub-pixels.

Furthermore, a black matrix 191 may be disposed between each phosphor layer to enhance contrast. In other words, the black matrix 191 can enhance the contrast of luminance.

However, the present invention may not be necessarily limited to this, and another structure for implementing blue, red and green lights may be also applicable thereto.

Referring to FIG. 5A, each of the semiconductor light emitting devices 150 may be implemented as a high-power light emitting device that emits various light including blue light in a manner that gallium nitride (GaN) is mostly used, and indium (In) and or aluminum (Al) are added thereto.

In this case, the semiconductor light emitting devices 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Referring to FIG. 5B, the semiconductor light emitting device may have a white light emitting device (W) provided with a yellow phosphor layer for each element. In this case, a red phosphor layer 181, a green phosphor layer 182 and a blue phosphor layer 183 may be provided on the white light emitting device (W) to implement a sub-pixel. Furthermore, the unit pixel may be formed by using a color filter repeated with red, green and blue on the white light emitting device (W).

Referring to FIG. 5C, it may also be possible to have a structure in which a red phosphor layer 181, a green phosphor layer 182 and blue phosphor layer 183 are provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking this example into consideration again, the semiconductor light emitting device 150 is placed on the conductive adhesive layer 130 to configure a sub-pixel in the display device. The semiconductor light emitting device 150 has an excellent luminance characteristic, and thus it may be possible to configure individual sub-pixels even with a small size thereof. The size of the individual semiconductor light emitting device 150 may be less than 80 μm in the length of one side thereof, and may be a rectangular or square shaped device. In case of a rectangular shaped device, the size thereof may be less than 20×80 μm.

Furthermore, even when a square shaped semiconductor light emitting device 150 with a length of side of 10 μm is used for a sub-pixel, it will exhibit sufficient brightness for implementing a display device. Accordingly, for example, in case of a rectangular pixel in which one side of a sub-pixel is 600 μm in size, and the remaining one side thereof is 300 μm, a relative distance between the semiconductor light emitting devices becomes sufficiently large. Accordingly, in this case, it may be possible to implement a flexible display device having an HD image quality.

A display device using the foregoing semiconductor light emitting device will be fabricated by a new type of fabrication method. Hereinafter, the fabrication method will be described with reference to FIG. 6.

FIG. 6 is a sectional view illustrating a method of manufacturing a display device using a semiconductor light emitting diode according to the present invention.

Referring to the drawing, first, the conductive adhesive layer 130 is formed on the insulating layer 160 where the auxiliary electrode 170 and second electrode 140 are located. The insulating layer 160 is deposited on the first substrate 110 to form one substrate (or wiring substrate), and the first electrode 120, the auxiliary electrode 170 and the second electrode 140 are disposed at the wiring substrate. In this case, the first electrode 120 and second electrode 140 may be disposed in an orthogonal direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on the substrate where the insulating layer 160 is located.

Next, a second substrate 112 having the plurality of semiconductor light emitting devices 150 which correspond to the locations of the auxiliary electrodes 170 and second electrodes 140 and constitute individual pixels is disposed such that the semiconductor light emitting device 150 faces the auxiliary electrode 170 and the second electrode 140.

In this case, the second substrate 112 as a growth substrate for growing the semiconductor light emitting device 150 may be a sapphire substrate or silicon substrate.

The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only portions between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer (not shown).

Furthermore, it may further include the process of forming a phosphor layer on one surface of the semiconductor light emitting device 150. For example, the semiconductor light emitting device 150 may be a blue semiconductor light emitting device for emitting blue (B) light, and a red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For such an example, the foregoing display device may also employ a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

FIG. 7 is a perspective view illustrating a display device using a semiconductor light emitting device according to another embodiment of the present disclosure. FIG. 8 is a cross-sectional view taken along line C-C in FIG. 7, and FIG. 9 is a conceptual view illustrating a vertical type semiconductor light emitting device in FIG. 8.

Referring to these drawings, the display device may be display device using a passive matrix (PM) type of vertical semiconductor light emitting device.

The display device may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and may be formed in a shape of a long bar in one direction. The first electrode 220 may be formed to perform the role of a data electrode.

The conductive adhesive layer 230 is formed on the substrate 210 where the first electrode 220 is located. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

In this manner, the semiconductor light emitting device 250 is placed on the conductive adhesive layer 230, thereby configuring a separate sub-pixel in the display device. Since the semiconductor light emitting device 250 has excellent brightness, it can constitute an individual unit pixel even though it has a small size. The individual semiconductor light emitting device 250 may have a size of 80 μm or less on one side, and may be a rectangular or square device. In case of a rectangular shaped device, the size thereof may be less than 20×80 μm.

The semiconductor light emitting device 250 may be a vertical structure.

A plurality of second electrodes 240 disposed in a direction of crossing the length direction of the first electrode 220, and electrically connected to the vertical semiconductor light emitting device 250 may be located between vertical semiconductor light emitting devices.

Referring to FIG. 9, the vertical type semiconductor light emitting device includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring again to FIG. 8, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this case, the red (R), green (G) and blue (B) sub-pixels may implement one pixel.

However, the present invention may not be necessarily limited to this, and another structure for implementing blue, red and green may be also applicable thereto as described above in a display device to which a flip chip type light emitting device is applied.

Taking this embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be disposed between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed as a bar-shaped electrode elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed as an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer (not shown) containing silicon oxide (SiOx) may be formed on the substrate 210 provided with the semiconductor light emitting device 250. When the transparent insulating layer is formed and then the second electrode 240 is placed thereon, the second electrode 240 may be located on the transparent insulating layer. Furthermore, the second electrode 240 may be formed to be spaced apart from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Therefore, an n-type semiconductor layer and a conductive material having good adhesiveness may be used as a horizontal electrode without being restricted by the selection of a transparent material, thereby enhancing the light extraction efficiency.

According to the drawing, a partition wall 290 may be disposed between the semiconductor light emitting devices 250. In other words, the partition wall 290 may be disposed between the vertical semiconductor light emitting devices 250 to isolate the semiconductor light emitting device 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics and simultaneously increase contrast even without an additional black insulator.

For another example, a reflective partition wall may be separately provided as the partition wall 290. In this case, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

In this manner, the semiconductor light emitting device 250 is placed on the conductive adhesive layer 230, thereby configuring a separate sub-pixel in the display device. Since the semiconductor light emitting device 250 has excellent brightness, it can constitute an individual unit pixel even though it has a small size. As a result, it may be possible to implement a full color display in which the sub-pixels of red (R), green (G) and blue (B) implement one pixel by means of the semiconductor light emitting device.

The exemplary embodiments of the present invention described above have a passive matrix (PM) type structure. The above-described embodiments are also applicable to an active matrix (AM) semiconductor light emitting device. However, in order to realize an active matrix, a thin film transistor and a semiconductor light emitting device must be disposed together in a pixel, which causes a difficulty in an efficient space use. The present invention provides a display structure that can efficiently use a pixel space.

Figure 10:
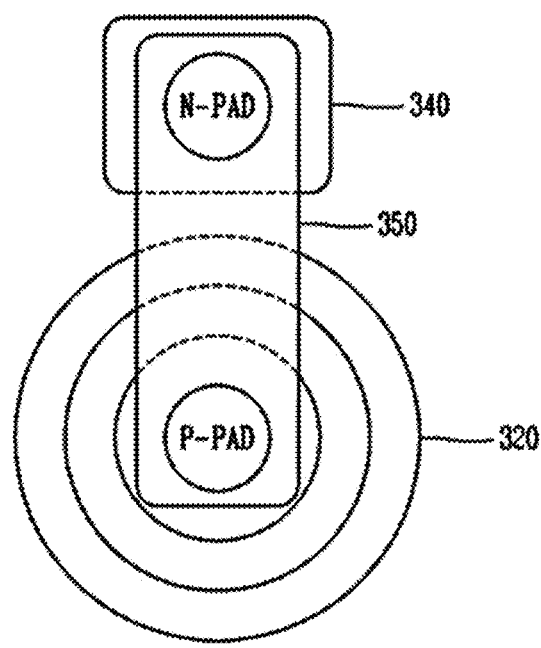
FIG. 10 is a planar view illustrating a display device of a new structure.
Figure 11:
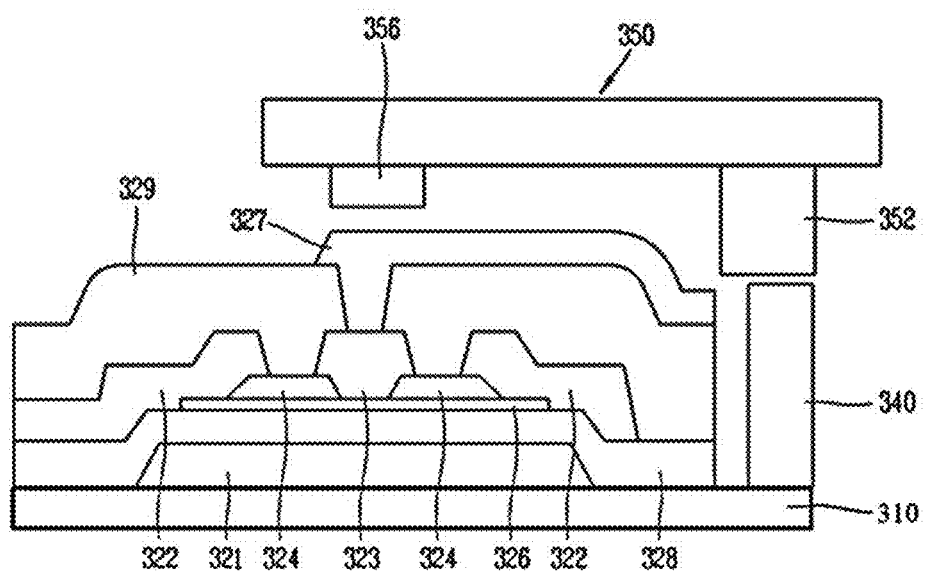
FIG. 11 is a sectional view illustrating a display device of a new structure.
Figure 12:
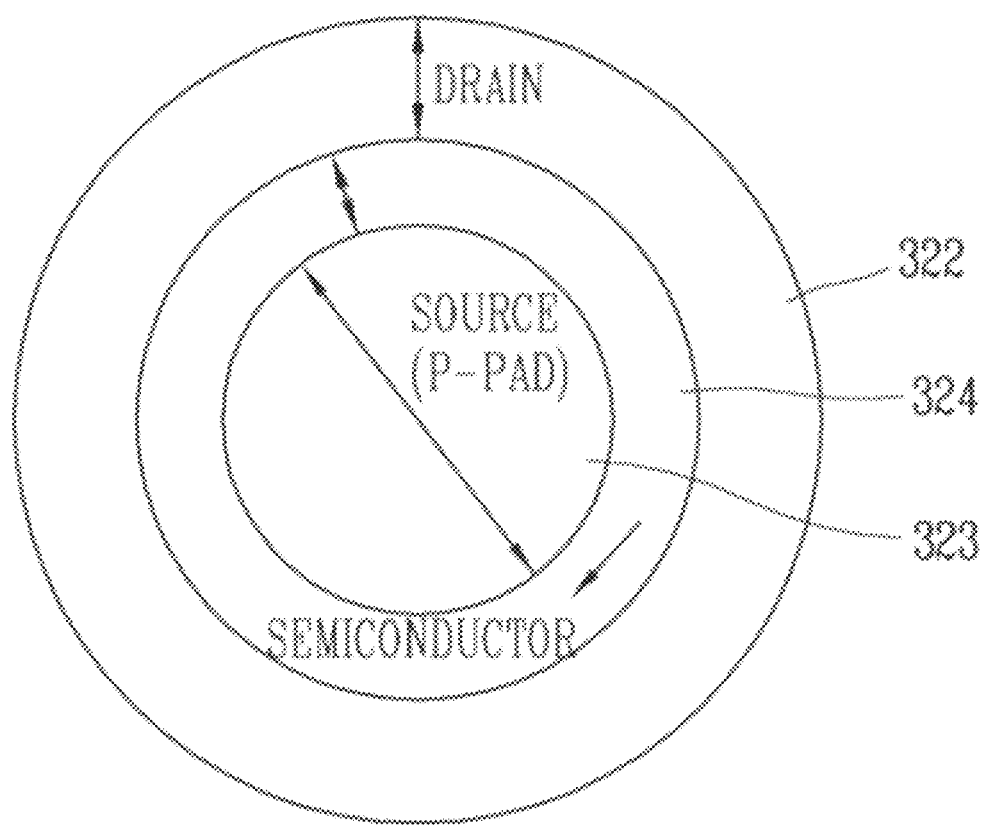
FIG. 12 is a planar view illustrating a thin film transistor according to the present invention.

FIG. 10 is a planar view illustrating a display device of a new structure, FIG. 11 is a sectional view illustrating a display device of a new structure, and FIG. 12 is a planar view illustrating a thin film transistor according to the present invention.

Referring to FIGS. 10 and 11, a thin film transistor 320, a semiconductor light emitting device 350, and a wiring electrode 340 are disposed on a substrate 310.

The substrate as a wiring substrate provided with the wiring electrodes may include polyimide (PI) to implement a flexible display device. In addition, any one may be used if it is an insulating and flexible material.

The semiconductor light emitting device 350 may be a flip chip type light emitting device. However, the present invention is not limited thereto, and a vertical type semiconductor light emitting device may be used.

The semiconductor light emitting device 350 includes a first conductive semiconductor, a first conductive semiconductor layer having the first conductive electrode 356 disposed thereon, an active layer disposed on the first conductive semiconductor layer, a second conductive semiconductor layer disposed on the active layer, and a second conductive electrode 352 disposed on the second conductive semiconductor layer.

In more detail, the first conductive electrode 356 and the first conductive semiconductor layer may be a p-type electrode and a p-type semiconductor layer, respectively. The second conductive electrode 352 and the second conductive semiconductor layer may be an n-type electrode and an n-type semiconductor layer, respectively. However, the present invention is not necessarily limited thereto, and may employ an example in which the first conductive electrode is the n-type and the second conductive electrode is the p-type.

The semiconductor light emitting device 350 is disposed to overlap the thin film transistor 320. Before explaining a structure of the display device according to the present invention, a structure of the thin film transistor 320 will be described in detail.

Referring to FIG. 11, the thin film transistor 320 includes a gate electrode 321, a gate insulating film 328, a semiconductor layer 326, an etch stopper 324, a drain electrode 322, a source electrode 323, a passivation layer 329, and a connection electrode 327. Although the n-type transistor is described in this specification, the present invention may also be applied to a p-type transistor. However, when a p-type transistor is used, a drain electrode of the p-type transistor is disposed at a position of a source electrode of an n-type transistor, and a source electrode of the p-type transistor is disposed at a position of a drain electrode of the n-type transistor. That is, when the p-type transistor is used, the source electrode and the drain electrode are reversed.

The gate electrode 321 may be made of a metal. In one embodiment, the gate electrode 321 may be made of molybdenum (Mo). More specifically, the gate electrode 321 may be formed by depositing a gate conductive film on a substrate, forming a photoresist pattern on the gate conductive film, and then selectively patterning the gate conductive film using the photoresist pattern as a mask.

At least a part of the gate electrode 321 may have a circular shape in a planar view. In one embodiment, a part of the gate electrode 321 may be formed in a circular shape, and the remaining part of the gate electrode 321 may be formed in a bar shape connected to the circular shape.

On the other hand, the gate insulating layer 328 is deposited on the gate electrode 321 and the semiconductor layer 326 is deposited on the gate insulating layer 328. A planar view of the semiconductor layer 326 may be circular.

In one embodiment, the gate insulating film 328 may be silicon oxide or silicon nitride.

In one embodiment, the semiconductor layer 326 may be formed of at least one of indium (In), gallium (Ga), zinc (Zn), tin (Sn), and aluminum (Al). Meanwhile, the semiconductor layer 326 may be made of a-IGZO (amorphous Indium Gallium Zinc Oxide). The semiconductor layer 326 may be formed on the same axis as the gate electrode 321.

Meanwhile, the etch stopper 324 may be formed on the semiconductor layer 326. In one embodiment, a planar view of the etch stopper 324 may be annular in shape. The etch stopper 324 may be made of silicon oxide.

The drain electrode 322 is formed on the etch stopper 324. The drain electrode 322 may be made of a metal, and molybdenum (Mo) may be used as an example.

Referring to FIG. 12, at least a part of the drain electrode 322 may have an annular shape or a shape in which a part of an annular shape is removed, in a planar view. On the other hand, the drain electrode 322 may further include a bar-shaped electrode portion in a planar view. Accordingly, a part of the drain electrode 322 may have an annular shape in a planar view and the remaining part may have a bar-like shape in the planar view.

The passivation layer 329 is formed on the drain electrode 322. In one embodiment, the passivation layer 329 may be made of silicon oxide.

Meanwhile, the source electrode 323 may be formed in a contact hole formed through the passivation layer 329. The source electrode 323 may be formed of a metal material. In one embodiment, the source electrode 323 may be made of molybdenum (Mo).

Referring to FIG. 12, the source electrode 323 may have a circular shape in a planar view.

An inner radius and outer radius of the annular shape of the drain electrode 322 may be greater than those of the annular shape of the etch stopper 324. Accordingly, a part of the etch stopper 324 is disposed between the drain electrode 322 and the source electrode 323 in a sectional view.

The connection electrode 327 is formed on the passivation layer and overlaps the source electrode 323. The connection electrode 327 plays a role of electrically connecting one of the p-type electrode and the n-type electrode of the semiconductor light emitting device 350 to the source electrode 323.

The thin film transistor 320 described above may be formed on the substrate. The display device according to the present invention provides a structure in which a part of the thin film transistor overlaps the semiconductor light emitting device.

Referring back to FIG. 10, each of the semiconductor light emitting devices 350 is disposed such that one of the p-type electrode and the n-type electrode overlaps the source electrode 323 of the thin film transistor 320. One of the p-type electrode and the n-type electrode overlaps the connection electrode 327 and the source electrode 323, and is electrically connected to the source electrode through the connection electrode 327.

Specifically, one of the p-type electrode and the n-type electrode is disposed inside the annular shape of the drain electrode 322. Accordingly, a part of the semiconductor light emitting device and a part of the thin film transistor overlap each other.

According to the structure, the source electrode 323 can be utilized as an internal electrode of the semiconductor light emitting device, and a limited space within a pixel can be utilized effectively. This may result in minimizing an area of the pixel.

On the other hand, the positions of the source electrode and the drain electrode may vary depending on the type of the thin film transistor. Specifically, when the thin film transistor 320o is a p-type transistor, the positions of the source electrode and the drain electrode are switched to each other. In addition, the semiconductor light emitting device 350 may overlap the drain electrode and may be disposed inside the annular shape of the source electrode.

On the other hand, a circuit of the display device may vary depending on the type of the thin film transistor.

FIG. 13 is a circuit view of a display device according to the present invention.

Referring to (a) of FIG. 13, when the thin film transistor is an n-type transistor, a source electrode of a driving TFT and an anode electrode of an LED are bonded and driven.

On the other hand, referring to (b) of FIG. 13, when the thin film transistor is a p-type transistor, the semiconductor light emitting device may receive a VDD signal. Since a gate of the thin film transistor is connected to a storage capacitor, a voltage corresponding to a data signal may be stored in this storage capacitor. As a result, a fluctuation width of the data signal transmitted through the driving TFT can be reduced, and thus the driving can be performed more stably than in the case of (a) of FIG. 13. Therefore, the connection state between the driving TFT and the LED for the AMOLED may preferably have the connection structure as illustrated in (b) of FIG. 13 in the case of a current-driven base, so as to enable more stable driving.

Figure 14:
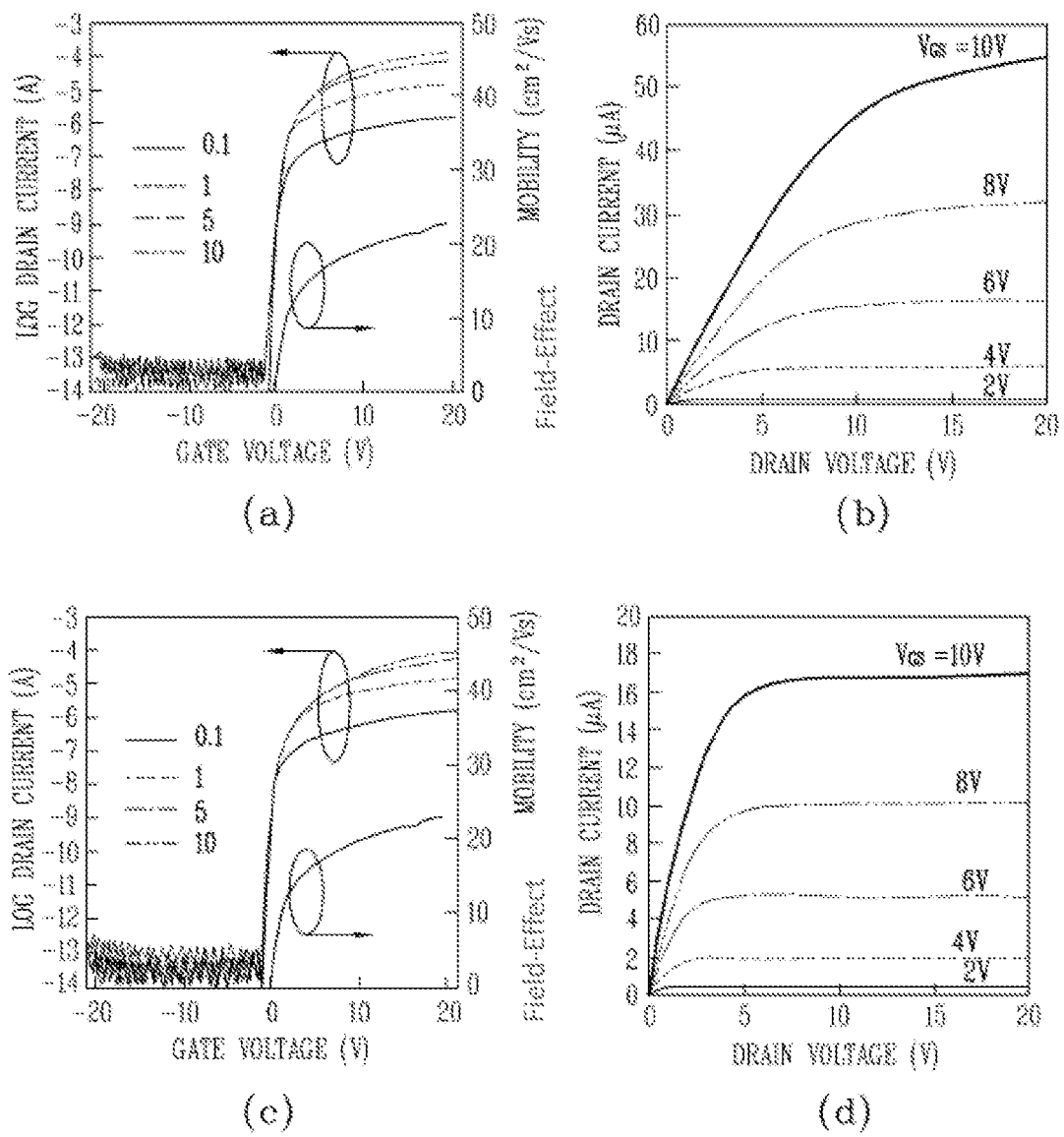
FIG. 14 is a graph showing electrical characteristics of a display device according to the present invention.

On the other hand, referring to FIG. 14, an oxide semiconductor-based thin film transistor has different electrical characteristics depending on a structure of the electrodes. That is, the oxide semiconductor-based thin film transistor may exhibit different characteristics when the source electrode is an external electrode ((a) and (b) of FIG. 14) and when the source electrodes is used as an internal electrode ((c) and (d) of FIG. 14). Finally, the best effect can be obtained when the internal electrode is used as a source electrode and applied to a driving thin film transistor for determining an LED current. A P electrode of the LED is bonded on the source electrode of the thin film transistor. In this case, only an insulating film and a metal line may be disposed below the source electrode so as not to be affected by a physical process, and an overlap area between the LED and the thin film transistor may be generated.

According to the present invention, by utilizing the internal electrode as the source electrode, fast saturation characteristics can be ensured, which may result in ensuring a constant LED current against a voltage drop that may occur due to a large-scale display or material requirements.

Hereinafter, a method of manufacturing a display device according to the present invention will be described.

Figure 15:
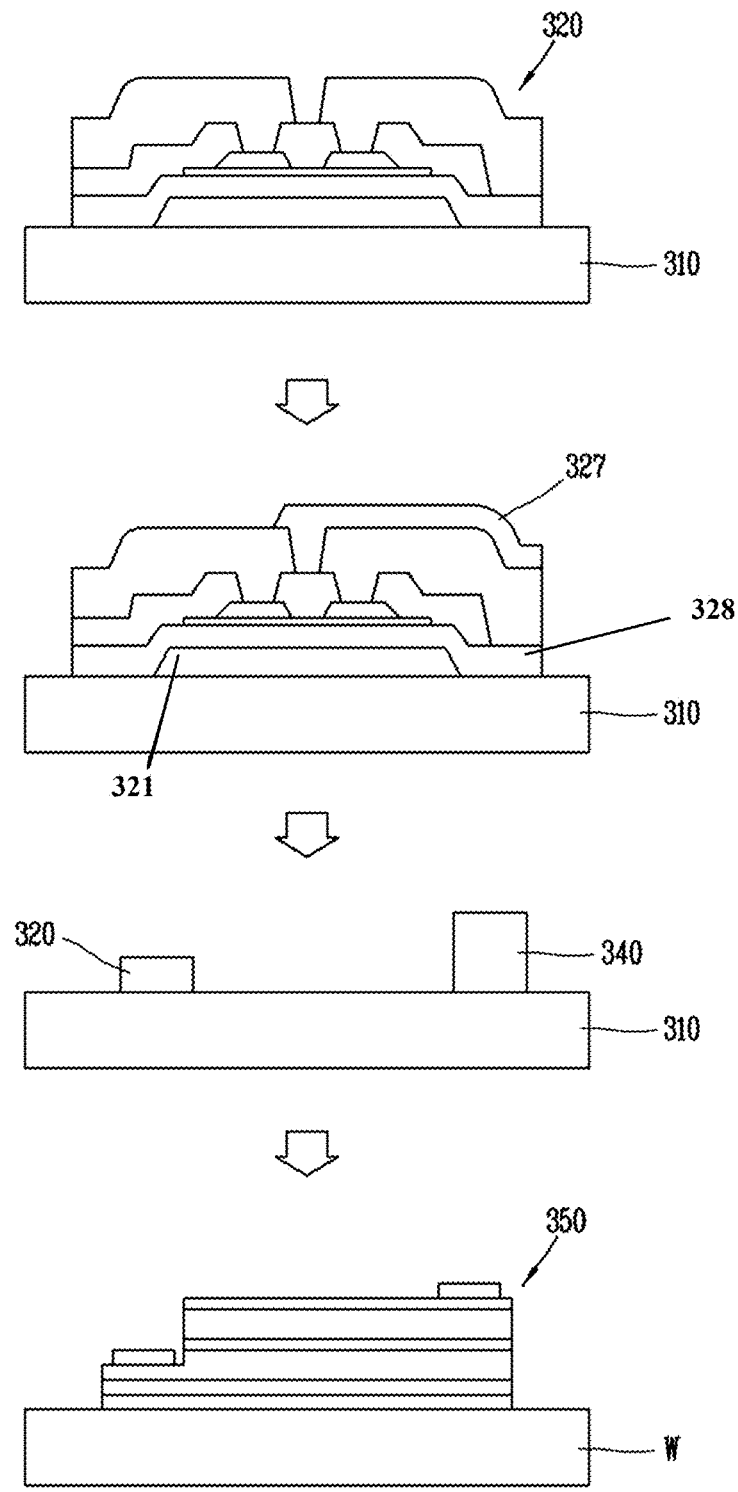

FIGS. 15 and 16 are conceptual views illustrating a method of manufacturing a display device according to the present invention.

Referring to FIG. 15, a step of forming a thin film transistor on a substrate 310 is performed. Thereafter, a step of forming a connection electrode 327 in a hole formed at a passivation layer is executed. On the other hand, a wiring electrode 340 electrically connected to an electrode, which does not overlap the thin film transistor, of p-type and n-type electrodes of a semiconductor light emitting device 350 is formed on the substrate 310. The thin film transistor 320 and the wiring electrode 340 are schematically shown in the third drawing of FIG. 15.

Next, a step of forming the semiconductor light emitting device 350 on a wafer W is executed. Thereafter, a step of transferring the semiconductor light emitting device 350 onto the substrate 310 is executed. In detail, referring to FIG. 16, the wafer W and the substrate 310 are aligned such that the first conductive electrode 356 of the semiconductor light emitting device 350 formed on the wafer W overlaps the thin film transistor 320 and the second conductive electrode 352 overlaps the wiring electrode 340, and then the wafer W and the substrate 310 are compressed. Finally, the wafer W is removed so that the semiconductor light emitting device 350 remains on the substrate 310.

The aforementioned display device using the semiconductor light emitting device are not limited to the configuration and the method of the embodiments described above, but the embodiments may be configured such that all or some of the embodiments are selectively combined so that various modifications can be made.

The invention claimed is:

1. A display device, comprising:
a substrate;
a thin film transistor disposed on the substrate;
a wiring electrode disposed on the substrate; and
a semiconductor light emitting device configured to emit light and having a p-type electrode and an n-type electrode,
wherein the thin film transistor includes:
a gate electrode disposed on the substrate,
a semiconductor layer disposed on the gate electrode,
a source electrode disposed on the semiconductor layer, and
a drain electrode disposed on the semiconductor layer and surrounding the source electrode, and
wherein the semiconductor light emitting device is disposed such that one of the p-type electrode and the n-type electrode overlaps the source electrode of the thin film transistor along a vertical direction, another of the p-type electrode and the n-type electrode overlaps the wiring electrode along the vertical direction, and the drain electrode overlaps the semiconductor light emitting device along the vertical direction, and
wherein a portion of the wiring electrode overlaps the semiconductor layer of the thin film transistor along a horizontal direction that is perpendicular to the vertical direction.

2. The display device of claim 1, wherein the drain electrode overlaps the semiconductor light emitting device between the source electrode and the wiring electrode.

3. The display device of claim 1, wherein the thin film transistor further comprises:
a passivation layer disposed on the source and drain electrodes; and
a connection electrode disposed on the passivation layer and penetrating through the passivation layer to electrically connect the source electrode to the one of the p-type electrode and the n-type electrode, and
wherein the connection electrode is directly connected with the one of the p-type electrode and the n-type electrode.

4. The display device of claim 3, wherein the one of the p-type electrode and the n-type electrode, the source electrode, and the connection electrode overlap one another.

5. The display device of claim 1, wherein the thin film transistor further comprises:
a gate insulating film located between the gate electrode and the source and drain electrodes.

6. The display device of claim 1, wherein the semiconductor layer is made of at least one of indium (In), gallium (Ga), zinc (Zn), tin (Sn), and aluminum (Al).

7. The display device of claim 1, wherein the source electrode overlaps the p-type electrode.

8. The display device of claim 1, wherein the thin film transistor further comprises:
an etch stopper located between the semiconductor layer and the source and drain electrodes.

9. The display device of claim 8, wherein the etch stopper has an annular shape, and the semiconductor layer has a circular shape.

10. The display device of claim 1, wherein the source electrode is located in an interior of the drain electrode having the annular shape.

11. The display device of claim 1, wherein the one of the p-type electrode and the n-type electrode that overlaps the source electrode of the thin film transistor is entirely overlapped by the gate electrode of the thin film transistor.

12. The display device of claim 1, wherein the semiconductor light emitting device extends from one of the source electrode and the drain electrode to the wiring electrode.

13. A display device, comprising:
a substrate;
a wiring electrode on the substrate;
a thin film transistor disposed on the substrate, and having a semiconductor layer, a source electrode disposed on the semiconductor layer, a drain electrode disposed on the semiconductor layer, and a gate electrode disposed on the substrate; and
a semiconductor light emitting device configured to emit light and having a first electrode and a second electrode,
wherein the first electrode of the semiconductor light emitting device is disposed on and electrically connected to one of the source electrode and the drain electrode, and the second electrode of the semiconductor light emitting device is electrically connected to the wiring electrode,
wherein the semiconductor light emitting device extends from one of the source electrode and the drain electrode to the wiring electrode, and
wherein a portion of the wiring electrode overlaps the second electrode of the semiconductor light emitting device along a vertical direction and overlaps the semiconductor layer of the thin film transistor along a horizontal direction that is perpendicular to the vertical direction.

14. The display device of claim 13, wherein the drain electrode encircles the source electrode, and the first electrode is electrically connected to the source electrode.

15. The display device of claim 14, wherein the thin film transistor further includes;
an etch stopper on the semiconductor layer; and
a passivation layer on the drain electrode, the source electrode, and the etch stopper, and
wherein the etch stopper is annular and encircles the source electrode.

16. The display device of claim 13, wherein one of the source electrode and the drain electrode is formed in a middle of the thin film transistor.

17. The display device of claim 13, wherein the thin film transistor further includes a connection electrode interposed between the source electrode and one of the first electrode and the second electrode.

18. The display device of claim 13, wherein the semiconductor light emitting device extends in a radial direction of the thin film transistor from one of the source electrode and the drain electrode.

19. The display device of claim 13, wherein the first electrode of the semiconductor light emitting device is entirely overlapped by the gate electrode of the thin film transistor.

* * * * *